United States Patent
Roy et al.

(10) Patent No.: US 6,792,667 B2
(45) Date of Patent: Sep. 21, 2004

(54) FULLY AUTOMATIC PROCESS FOR MAGNETIC CIRCUIT ASSEMBLY

(75) Inventors: Apurba Roy, Carlsbad, CA (US); Florencio Eiranova, Encinitas, CA (US)

(73) Assignee: di/dt, Inc., Carlsbad, CA (US)

( * ) Notice: Subject to any disclaimer, the term of this patent is extended or adjusted under 35 U.S.C. 154(b) by 330 days.

(21) Appl. No.: 10/041,792

(22) Filed: Oct. 23, 2001

(65) Prior Publication Data

US 2003/0074781 A1 Apr. 24, 2003

(51) Int. Cl.⁷ .................................................. H01F 7/06
(52) U.S. Cl. ...................... 29/602.1; 29/592.1; 29/605; 29/606; 29/832; 29/846; 336/83; 336/200; 336/212; 336/223; 174/260
(58) Field of Search ............................. 29/892.1, 602.1, 29/603.04, 603.06, 605, 606, 832, 846; 336/83, 200, 212, 223; 174/260

(56) References Cited

U.S. PATENT DOCUMENTS

| | | | |
|---|---|---|---|
| 5,257,000 A | * 10/1993 | Billings et al. | ............. 336/200 |
| 5,574,420 A | 11/1996 | Roy et al. | ................... 336/200 |
| 5,634,262 A | * 6/1997 | O'Donnell et al. | ........... 29/606 |
| 6,094,123 A | 7/2000 | Roy | ........................... 336/200 |
| 6,147,583 A | * 11/2000 | Rinne et al. | ................ 336/200 |
| 6,239,683 B1 | * 5/2001 | Roessler et al. | ............ 336/200 |
| 6,365,435 B1 | * 4/2002 | Wang et al. | ................ 438/108 |

FOREIGN PATENT DOCUMENTS

| JP | 03286508 A | * 12/1991 | ........... H01F/15/04 |
|---|---|---|---|
| JP | 06293077 A | * 10/1994 | ........... B29C/65/40 |

OTHER PUBLICATIONS

"Optimal design of a toroidal transformer fed by nonsinusoidal high frequency current"; Nimet, O.; Grellet, G.; Morel, H.; Rousseau, J.J.; Ligot, D.; Power Electronics and Variable Speed Drives, 2000; Sep. 18–19, 2000; pp.: 57–62.*

* cited by examiner

Primary Examiner—A. Dexter Tugbang
(74) Attorney, Agent, or Firm—Lowenstein Sandler PC (57) ABSTRACT

In accordance with the invention, a high quality magnetic device is produced without manual intervention by the step of providing a substrate including an aperture and conductive coil extending peripherally around the aperture and bonding together two parts of a magnetic body extending through the aperture. The two parts have substantially planar mating surfaces, and the bonding is effected by securing one of the parts to the substrate, applying adhesive to the portion of its mating surface exposed within the aperture, and pressing the mating surface of the second part into contact with the mating surface of the first part. During pressing, the mating surfaces are rotated in a reciprocating fashion to spread the adhesive into a thin, highly uniform film.

10 Claims, 8 Drawing Sheets

FULLY AUTOMATIC PROCESS FOR MAGNETIC CIRCUIT ASSEMBLY

FIELD OF THE INVENTION

The invention relates to electronic circuits which include magnetic devices and, in particular, to a method for automatic in-line assembly of circuits including such devices.

BACKGROUND OF THE INVENTION

Electronic circuits including magnetic devices such as inductors and transformers serve a wide variety of essential functions. Such circuits, for example, serve as power supplies. Inductors are used as choke coils for energy storage and to minimize noise and AC ripple, and transformers are used to change voltage level and provide isolation. The magnetic devices are often made of a magnetic core, such as ferrite, wound with conductive coils.

Magnetic devices have historically been difficult to miniaturize. The profile heights of magnetic devices have been reduced through the use of ferrites. See U.S. Pat. No. 5,574,420 issued to A. Roy et al. on Nov. 12, 1996 and U.S. Pat. No. 6,094,123 issued to A. Roy on Jul. 25, 2000, which are incorporated herein by reference. However even these devices must be assembled as essentially complete units (coils wound around ferrites) before being applied in hybrid circuits.

A more recently developed approach to assembling magnetic devices on a substrate such as PC board is to print a conductive coil on the board around an aperture and bond together two parts of a ferrite body extending through the aperture.

To make a high quality device, the bond must be thin, uniform in thickness and durable. As a consequence, it has been necessary to clamp the ferrite parts together under pressure while the adhesive cures. This clamping step is time-consuming and typically requires manual intervention, thereby precluding automatic in-line assembly. Accordingly there is a need for a fully automatic process for the assembly of circuits containing magnetic components.

SUMMARY OF THE INVENTION

In accordance with the invention, an electronic circuit containing one or more magnetic devices is assembled by the steps of providing a substrate including an aperture and conductive coil extending peripherally around the aperture and bonding together two parts of a magnetic body extending through the aperture. The two parts have substantially planar mating surfaces, and the bonding is effected by securing one of the parts to the substrate, applying adhesive to the portion of its mating surface exposed within the aperture, and pressing the mating surface of the second part into contact with the mating surface of the first part. During pressing, the mating surfaces are rotated in a reciprocating fashion to spread the adhesive into a thin, highly uniform film. This process permits the formation in the cure operation of a high quality bond without clamping. It thus produces a high quality magnetic device without manual intervention and can be part of a fully automated process to fabricate a circuit assembly. In a preferred embodiment, the substrate includes auxiliary apertures for receiving corresponding protrusions from a part in the form of an E core and the mating surface of the E core extends through the coil aperture where it is bonded to a part in the form of a flat core.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphical illustrations, are not to scale.

DETAILED DESCRIPTION

Figure 1:
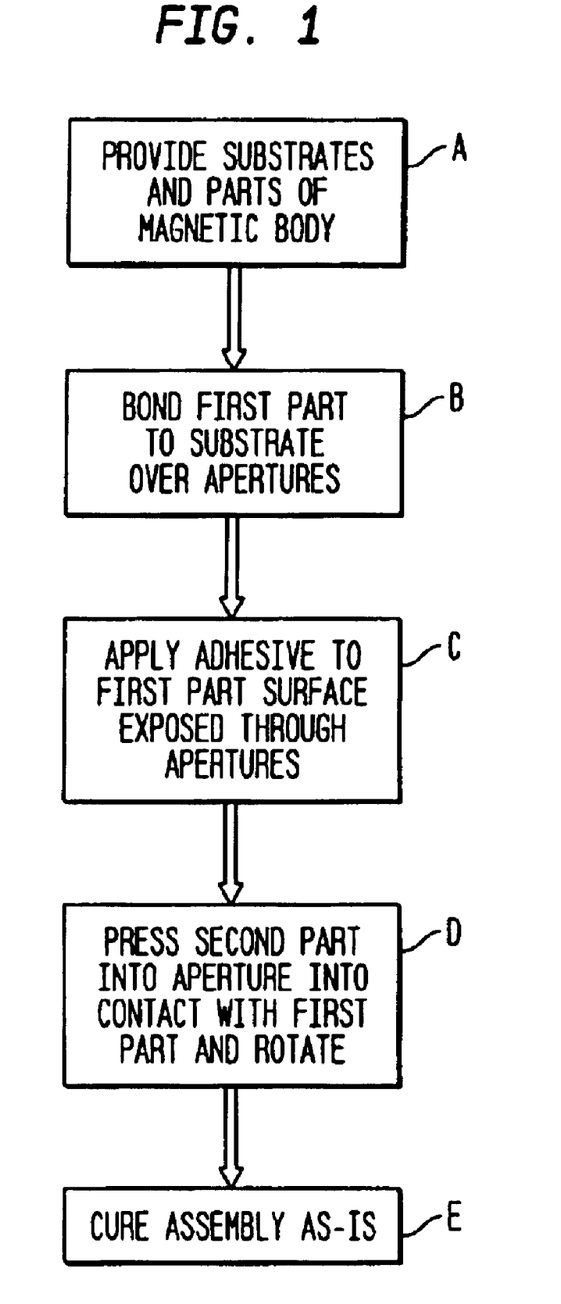
FIG. 1 is a flow diagram of the steps involved in fabricating an electronic circuit containing one or more magnetic devices.

Referring to the drawings, FIG. 1 is a flow diagram depicting the steps in fabricating an electronic circuit containing one or more magnetic devices. The first step, shown in Block A of FIG. 1, is to provide a substrate and two parts of a magnetic body to be bonded together.

Figure 2A:
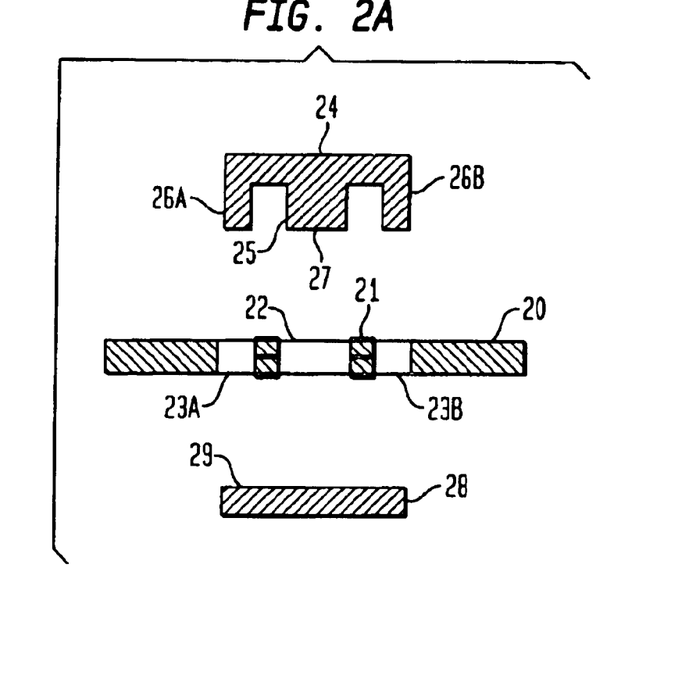
FIGS. 2A and 2B illustrate components provided in step A of FIG. 1.
Figure 2B:
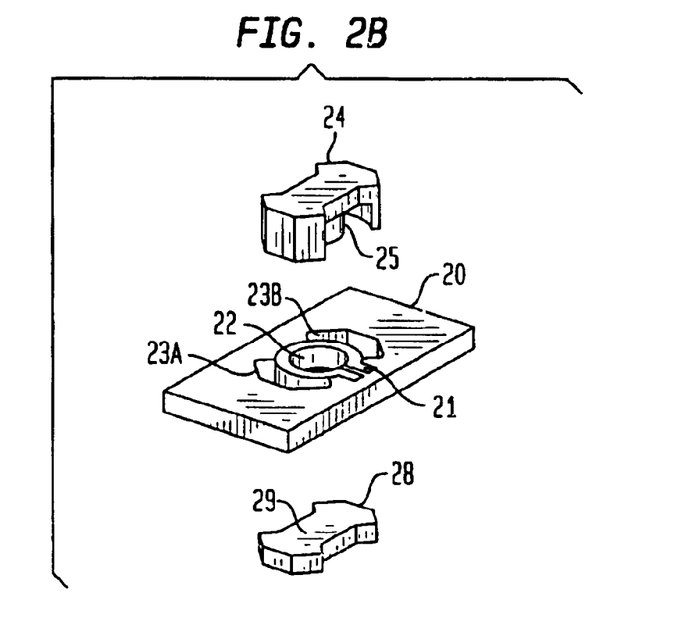

FIGS. 2A and 2B are cross sectional and perspective views, respectively, illustrating a substrate 20 having a printed coil 21 and an aperture 22 through the substrate 20 and within the coil 21. The substrate 20 also advantageously includes at least two auxiliary apertures 23A, 23B on opposite sides of aperture 22 to receive projections from a magnetic body 24. The magnetic body 24 (here an E core) has projections 25, 26A and 26B for projecting through the apertures 22, 23A and 23B, respectively. Projection 25, which projects through the coil-surrounded aperture 22, includes a planar mating surface 27 to be bonded to a second magnetic body part 28 (here a flat core). The projections 26A, 26B also preferably have planar mating surfaces. The second part 28 is preferably a generally flat body having a planar mating surface 29 for bonding with the mating surfaces of body 24.

Figure 3A:
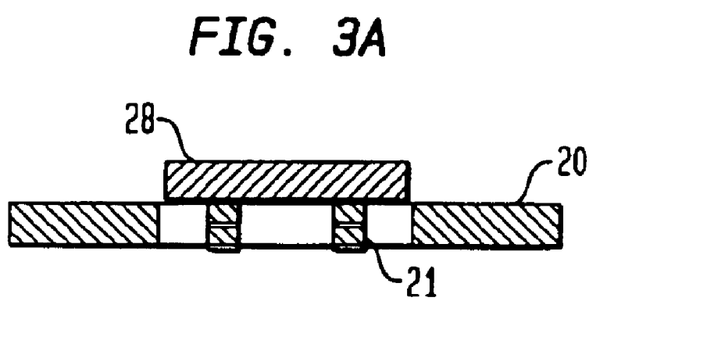
FIGS. 3A and 3B show the first part of the magnetic body bonded to the substrate.
Figure 3B:
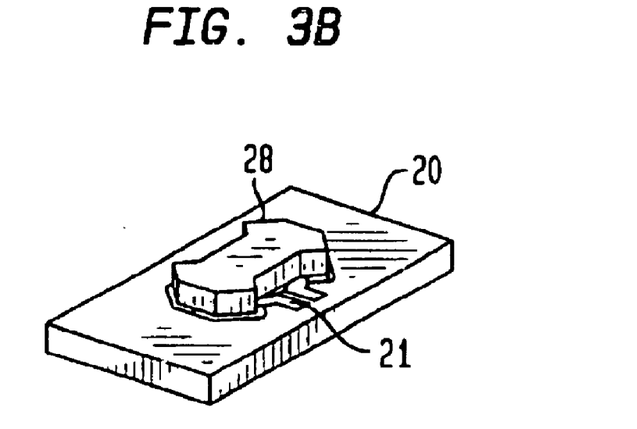

The next step, shown in block B, is to secure one part of the magnetic body to the substrate. This can be accomplished, for example, by applying adhesive to the substrate (e.g. applying adhesive "dots" using automatic machinery) and disposing part 28 on the substrate covering aperture 22 and apertures 23A, 23B. The disposition can be by automatic pick-and-place equipment. The adhesive is then cured. FIGS. 3A and 3B are cross sectional and perspective views illustrating part 28 bonded to substrate 20 via adhesive.

Figure 4A:
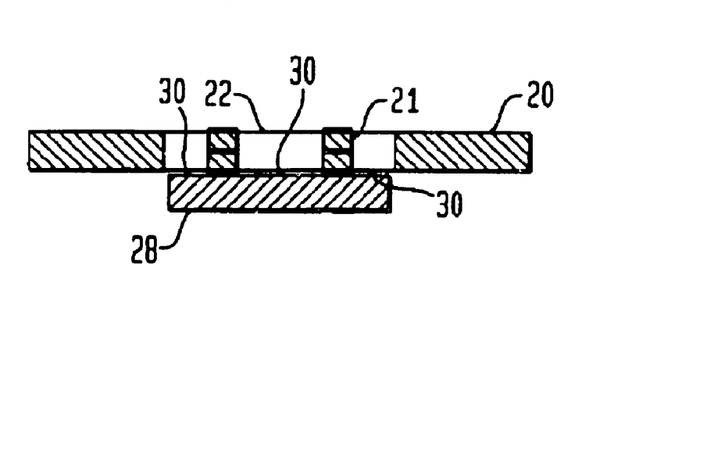
FIGS. 4A and 4B illustrate adhesive applied to the mating surfaces of the first part.
Figure 4B:
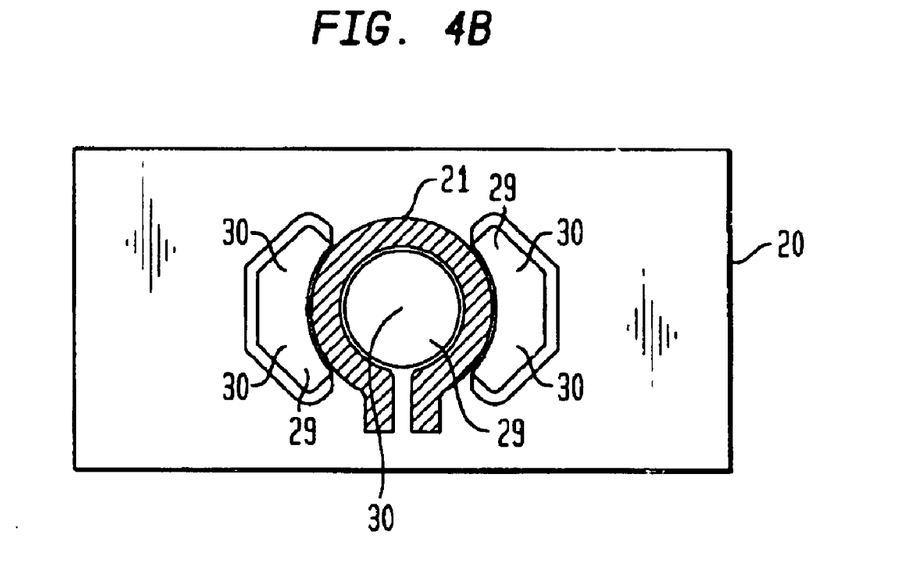

The third step (block C) is to apply adhesive between the mating surfaces of the two parts 24, 28. This is preferably accomplished by inverting the substrate and using automatic machinery to apply adhesive dots to the surfaces of part 28 exposed through the apertures. FIGS. 4A and 4B are cross section and top views of substrate 20 inverted with the mating surface 29 of part 28 shown underlying the apertures 22, 23A and 23B. Adhesive dots 30 have been applied to the mating surface 29 of part 28.

The next step shown in Block D is to press the mating surfaces of the other part 24 of the magnetic body into contact with the mating surfaces of the adhered part 28 and, while applying pressure, to rotate the mating surfaces in relation to each other in a reciprocating fashion to spread the adhesive into a thin, highly uniform film. This can be accomplished by a programmable pick-and-place machine programmed to provide both pressure and the desired reciprocating rotation. Typical parameters are 1–20N of pressure, 1–5° rotational amplitude, 1–10 Hz reciprocation frequency and 1–5 sec duration.

Figure 5A:
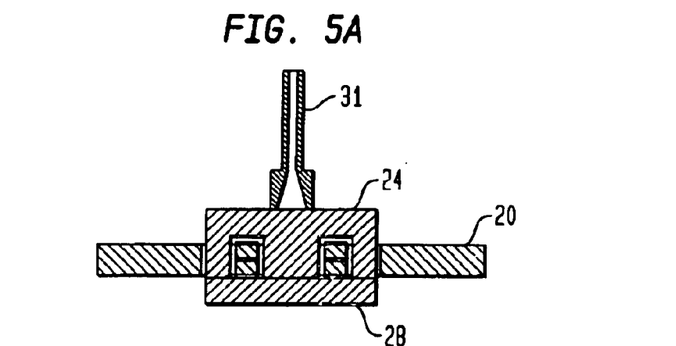
FIGS. 5A, 5B and 5C show the second part of the magnetic body pressed onto and rotated against the first part.
Figure 5B:
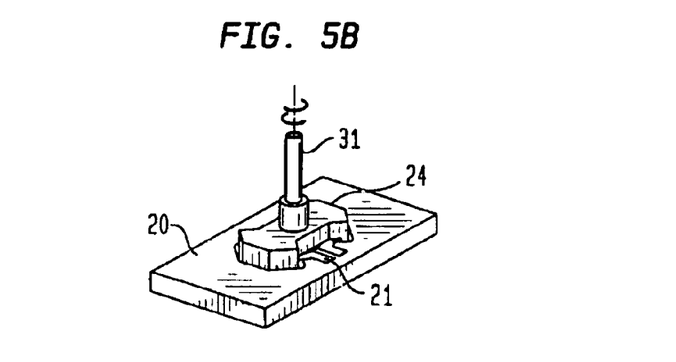
Figure 5C:
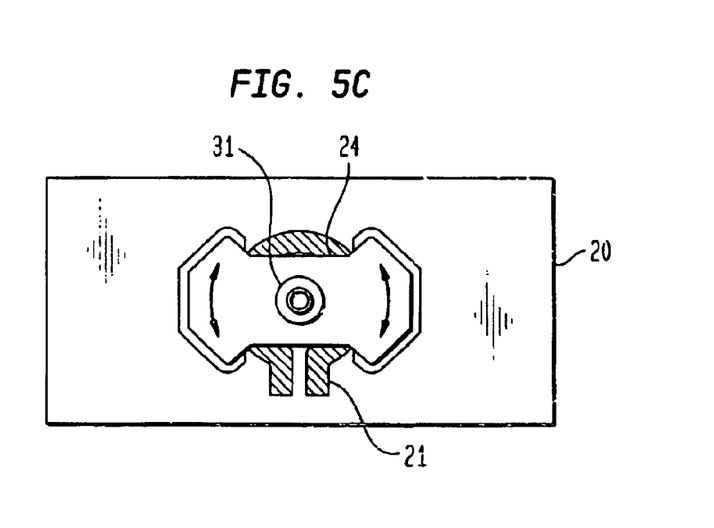

FIGS. 5A, 5B and 5C are cross sectional, perspective and top views of illustrating the step of pressing together the magnetic components 24, 28 and rotating one of the components 24 in relation to the other (28 adhered to the substrate 20). The pressing and rotating can be carried out by the arm 31 of an automatic pick-and-place machine.

The adhesive can then be cured without clamping, i.e. the cure can take place without the necessity of any force other than gravity. The curing step is illustrated in block E of FIG. 1.

Figure 6A:
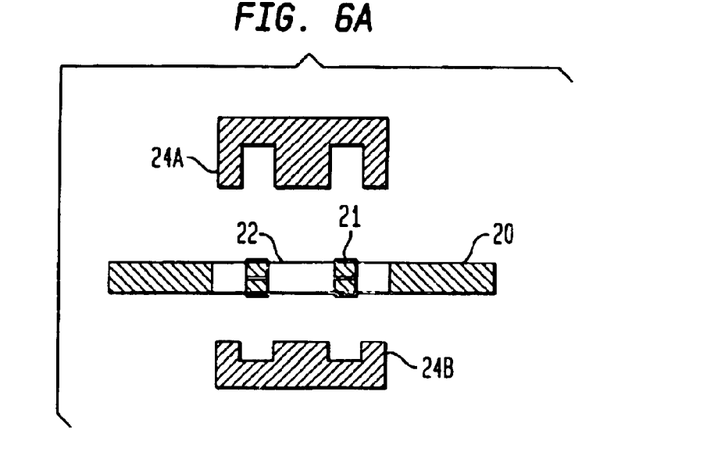
FIGS. 6A, 6B, 6C and 6D illustrate an alternative embodiment of the process of FIG. 1.
Figure 6B:
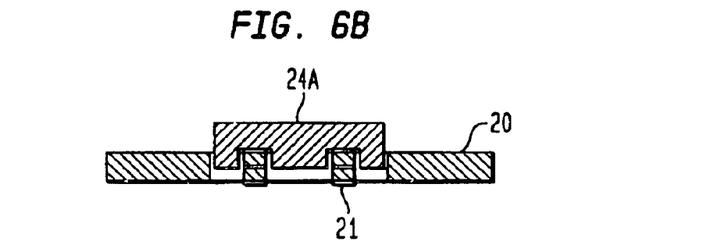
Figure 6C:
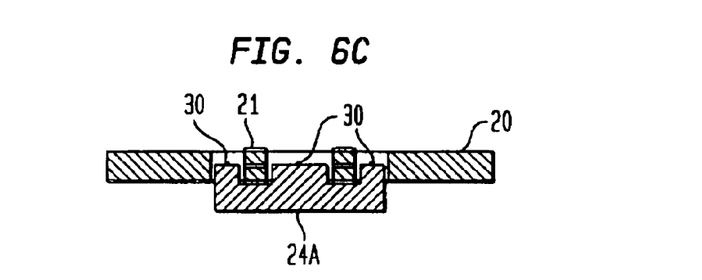
Figure 6D:
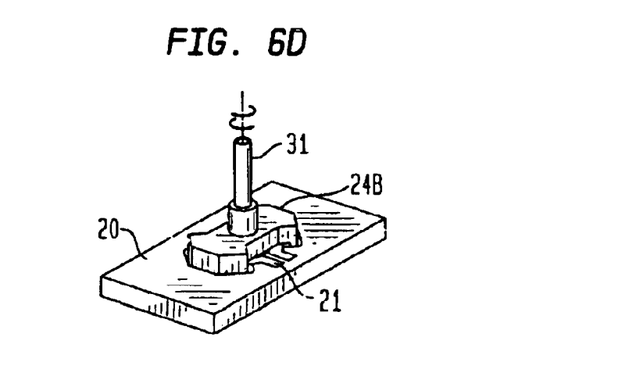

In an alternative embodiment of the process of FIG. 1, both parts of the magnetic body are E cores. FIG. 6A illustrates the substrate 20 and the two parts 24A and 24B. FIG. 6B shows a first part of the magnetic body 24A bonded to the substrate 20. FIG. 6C illustrates the FIG. 6B structure inverted and adhesive dots 30 disposed on the mating surfaces of the adhered part 24A. FIG. 6D is a perspective view showing the second part of the magnetic body 24B pressed into the mating surfaces of part 24A and rotated in relation to part 24A. The structure is then cured without clamping.

The invention can now be better understood by consideration of the following specific example.

EXAMPLE

Figure 7:
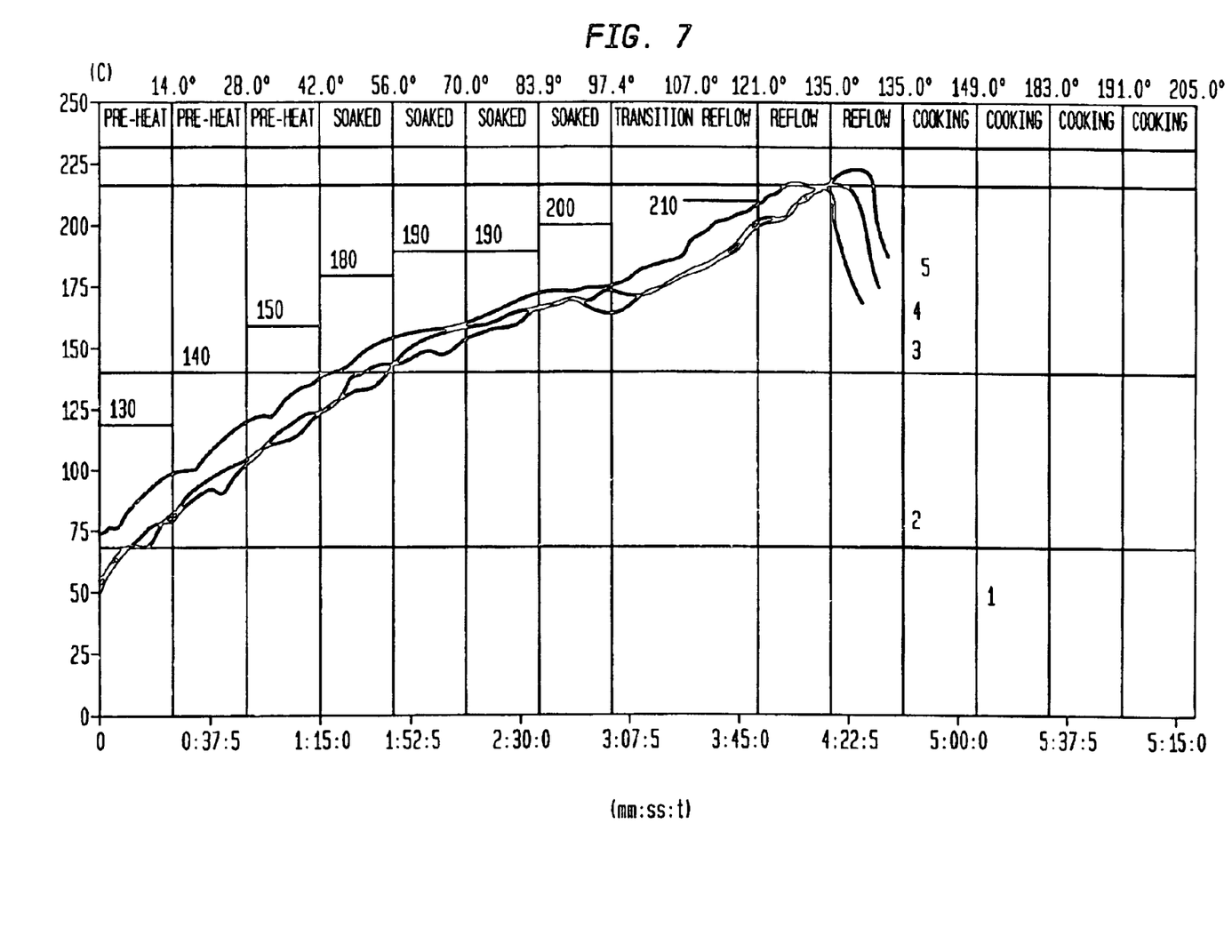
FIG. 7 is a graphical illustration of a typical reflow profile.

Adhesive dots of Loctite 3615 adhesive were applied to the bottom side of a PWB substrate using a positive auger type dispenser with a 25 gage footed dispensing needle. Four 0.030" diameter dots were dispensed for each flat core to achieve a nominal ferrite-substrate bond line (thickness) of 3–4 mil (0.0030"–0.0040"). Flat ferrite cores were pick-and-placed on the dots and overlying the apertures in the PWB substrate. Other circuit components such as capacitors and integrated circuits were also pick-and-placed onto solder pads the bottom side, and substrate was subjected to heating using a standard reflow profile to effect both cure of the adhesive and solder reflow at the same time. FIG. 7 is a graphical illustration of a typical reflow profile for this purpose.

The PWB was then inverted and dots of Zymet T505 ferrite adhesive were dispensed on the ferrite surfaces exposed through the apertures in the PWB. Dispensation was through a 27 gage footless needle. Dispense pressure was 15 psi. Dispense time was 200 ms. 5 dots were applied for larger cores, 3 dots for small transformers and 2 dots for small inductors.

E core ferrite parts were then pick-and-placed onto the adhesive dotted flat cores, pressed against the flat cores and scrubbed under pressure against the flat cores (reciprocated rotation). The scrubbing parameters were 3N force, 5 Hz frequency, 2° amplitude and 3 s scrub time. Other components of the circuit were pick-and-placed onto solder pads on the inverted surface.

The substrate was then subjected to heat in a simultaneous reflow/adhesive cure step at 70–250° C.

Figure 8:
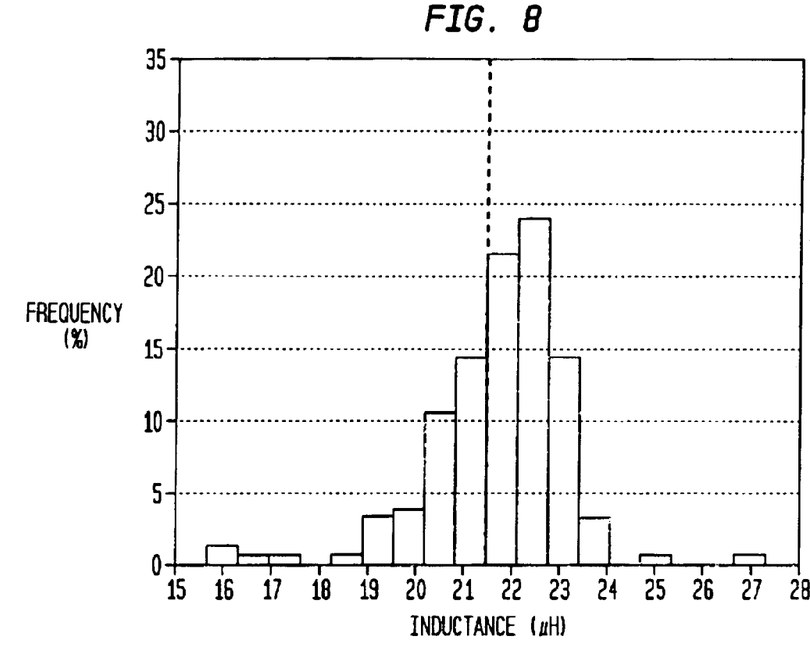
FIGS. 8 and 9 are histograms showing the inductance distribution in sets of devices made in accordance with the invention.
Figure 9:
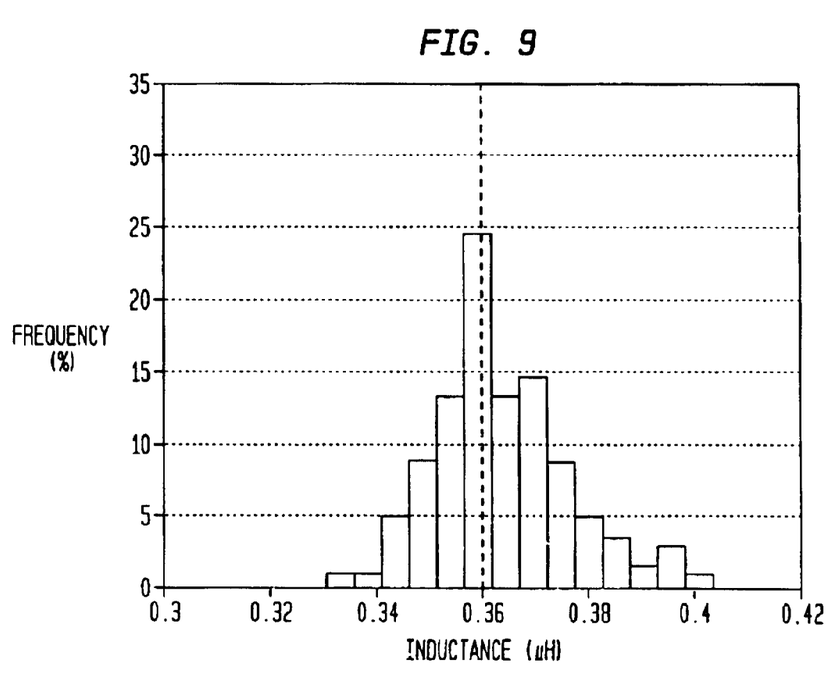

Transformers and inductors made substantially as described in the Example demonstrated excellent performance for inductance and for core-to-core adhesion. For transformers designed to have a nominal inductance of 21.5 $\mu$H, the average inductance was 21.70 $\mu$H with a standard deviation of 1.461 $\mu$H. FIG. 8 is a histogram showing the inductance distribution for a sample set of 153 devices. For inductors designed to have a nominal inductance of 0.36 $\mu$H the average inductance was 0.36 $\mu$H with a standard deviation of 0.0126 $\mu$H. FIG. 9 is a histogram showing the inductance distribution for a sample set of 306 devices. The core-to-core adhesion was measured both before and after 48 hours of humidity testing (48 hours at 85° C., 85% humidity). The results indicated bonding strength greater than the strength of the ferrite material and substantially no deterioration due to humidity testing.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A method for making a circuit assembly which includes at least one magnetic device comprising the steps of:
   a) providing first and second parts of a magnetic body and a substrate having first and second major surfaces, the substrate including an aperture therethrough and a conductive coil extending peripherally around the aperture;
   b) bonding the first part of the magnetic body to the first major surface of the substrate with adhesive material so that the first part overlies the aperture and a portion of the first part is exposed through the aperture;
   c) applying adhesive material to the portion of the first part exposed through the aperture;
   d) pressing the second part of the magnetic body through the aperture into contact with the adhesive of the first part and, under pressure, rotating the second part in relation to the first part in a reciprocating manner to spread the adhesive into a thin, uniform film; and
   e) curing the adhesive without clamping to bond together the first and second parts.

2. The method of claim 1 wherein the first surface includes a plurality of solder bonding pads and one or more electronic components are solder bonded to the first surface prior to step c.

3. The method of claim 2 wherein the first part and the one or more electronic components are applied to the first surface by pick-and-place surface mounting.

4. The method of claim 2 wherein the first part is bonded to the first surface and the electronic components are solder bonded to the first surface in a single heating step.

5. The method of claim 1 wherein the second surface includes a plurality of solder bonding pads and one or more electronic components are solder bonded to the second surface.

6. The method of claim 5 wherein the second part is bonded to the first part and the electronic components are solder bonded to the second surface in a single heating step.

7. The method of claim 1 wherein the pressing in step d is at a pressure in the range 1–20N.

8. The method of claim 1 wherein the rotation is at an amplitude in the range 1–5° and the reciprocation is at a frequency of 1–10 Hz for a duration of 1–5 s.

9. The method according to claim 1 wherein the first part of the magnetic body comprises a flat core ferrite body and the second part of the magnetic body comprises an E core ferrite body.

10. The method according to claim 1 wherein the first part of the magnetic body comprises an E core ferrite body.

* * * * *